US008732641B1

(12) United States Patent
Yuh et al.

(10) Patent No.: US 8,732,641 B1
(45) Date of Patent: May 20, 2014

(54) PATTERN MATCHING BASED PARASITIC EXTRACTION WITH PATTERN REUSE

(71) Applicant: Taiwan Semiconductor Manufacturing Co., Ltd., Hsin-Chu (TW)

(72) Inventors: Ping-Hung Yuh, New Taipei (TW); Hsin-Yun Lin, Puli Township (TW); Cheng-I Huang, Hsinchu (TW); Chung-Hsing Wang, Baoshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/677,380

(22) Filed: Nov. 15, 2012

(51) Int. Cl.
*G06F 17/50* (2006.01)

(52) U.S. Cl.
USPC ............ 716/110; 716/111; 716/112; 716/136

(58) Field of Classification Search
USPC .......................... 716/111, 112, 118, 119, 126
See application file for complete search history.

(56) References Cited

U.S. PATENT DOCUMENTS 6,473,881 B1 * 10/2002 Lehner et al. ................. 716/107
2010/0185994 A1 * 7/2010 Pikus et al. ....................... 716/5
2010/0242011 A1 * 9/2010 Mukai et al. ..................... 716/19
2010/0325595 A1 * 12/2010 Song et al. ..................... 716/108
2012/0023465 A1 * 1/2012 Gopalakrishnan et al. ... 716/102

* cited by examiner

*Primary Examiner* — Jack Chiang
*Assistant Examiner* — Brian Ngo
(74) *Attorney, Agent, or Firm* — Eschweiler & Associates, LLC

(57) ABSTRACT

The present disclosure relates to a method and apparatus for accurate RC extraction. A pattern database is configured to store layout patterns and their associated 3D extraction parameters. A pattern-matching tool is configured to partition a design into a plurality of patterns, and to search the pattern database for a respective pattern and associated 3D extraction parameters. If the respective pattern is already stored in the pattern database, then the associated 3D extraction parameters stored in the database are assigned to the respective pattern without the need to extract the respective pattern. If the respective pattern is not stored in the pattern database, then the extraction tool extracts the pattern and stores its associated 3D extraction parameters in the pattern database for future use. In this manner a respective pattern is extracted only once for a given design or plurality of designs. Moreover, the extraction result may be applied multiple times for a given design simultaneously, speeding up computation time. The extraction result may also be applied to a plurality of designs simultaneously.

17 Claims, 8 Drawing Sheets

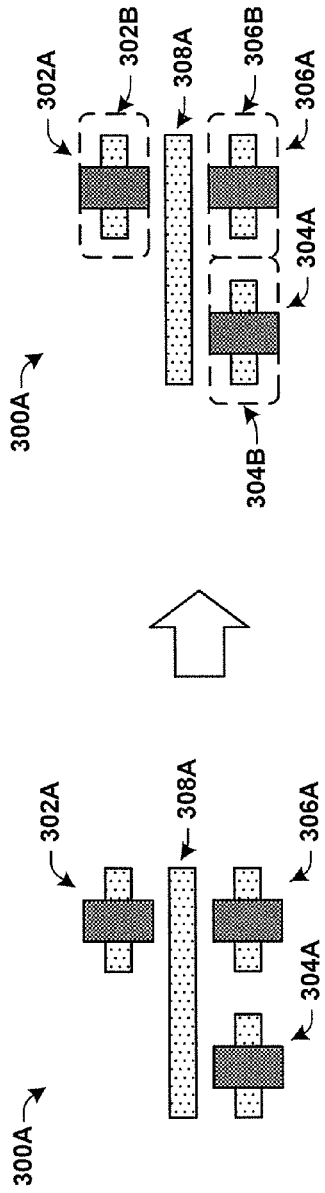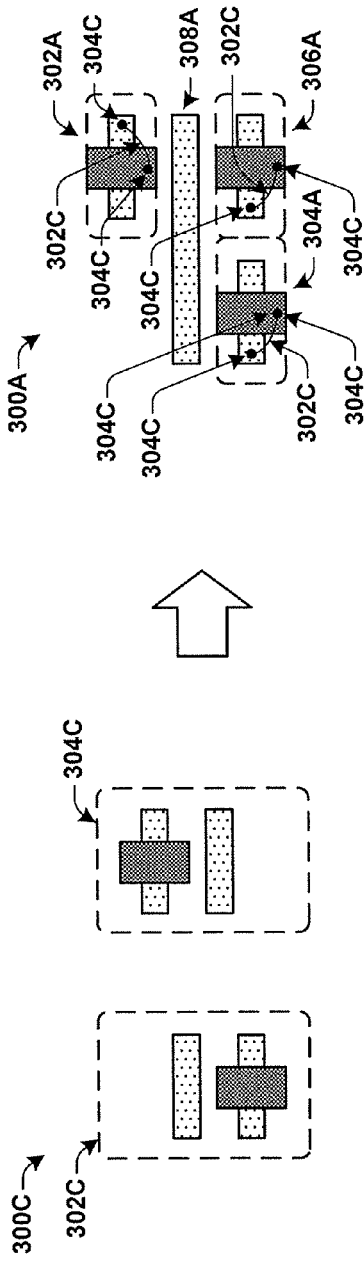

PATTERN MATCHING BASED PARASITIC EXTRACTION WITH PATTERN REUSE

BACKGROUND

In advanced semiconductor technology-nodes such as Node-20 or Node-14, RC parasitics have become a dominating effect. In less advanced technology nodes the effect of RC parasitics could be addressed using approximate methods such as pre-characterization of devices and 2.5 D extraction without appreciable loss of accuracy. Accurate RC parasitic modeling is necessary for device modeling, extraction, and timing analysis. More accurate methods such as pure 3D extraction are available, but pose an intrinsic performance limitation for extraction tools for large-scale designs.

BRIEF DESCRIPTION OF THE DRAWINGS

FIGS. 3A-3D illustrate some embodiments method of RC extraction utilizing pattern-matching in a layout.

DETAILED DESCRIPTION

Figure 1:
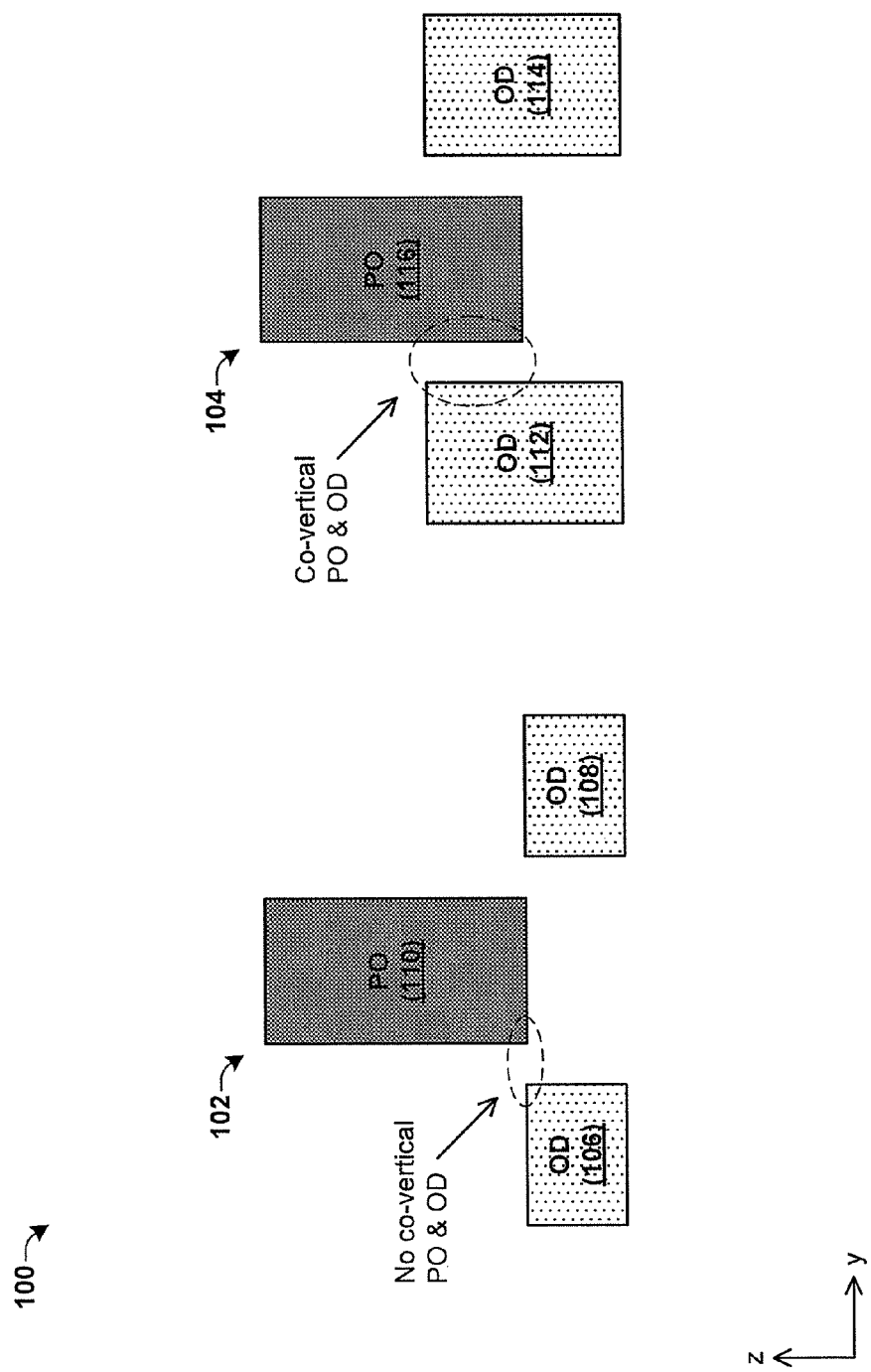
FIG. 1 illustrates a cross-sectional view of a comparison of a planar FET and a finFET.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1 illustrates a cross-sectional view 100 of a comparison of a planar FET 102 and a finFET 104. The planar FET 102 comprises a source 106, a drain 108, and a gate 110, wherein the source 106 and drain 108 further comprise an oxide definition (OD) material and the gate 110 further comprises a poly oxide (PO) material. The finFET 104 comprises a source 112, a drain 114, and a gate 116, wherein the source 112 and drain 114 further comprise an OD material and the gate 116 further comprises a PO material. The planar FET 102 represents a workhorse device of less advanced semiconductor technology nodes (e.g., Node-28 and prior), whereas the finFET 104 represents a workhorse device of advanced semiconductor technology-nodes (e.g., Node-20 and beyond).

For integrated circuit (IC) designs parasitic extraction is used in conjunction with modeling and timing analysis to describe the performance of the IC. Parasitic extraction can be computationally-intensive as semiconductor technology node scaling approximately doubles the number of shapes (i.e., devices) on an IC with each successive node. To offset this, mitigation schemes such a pre-characterization of IC components prior to full chip assembly may be performed. In less advanced semiconductor technology nodes this approximation resulted in minimal accuracy loss. However, as the relative contribution of RC parasitic to IC performance has increased, this accuracy loss is no longer negligible. Pre-characterization of IC components also has the drawback that not all of the environment around a respective IC component is accurately represented. Pre-characterization also limits the range of IC component use. Another mitigation method to enhance extraction performance in semiconductor technology nodes wherein planar FETs are utilized is 2.5-dimensional (2D) extraction. In 2D extraction approximations are made along one or more axes of a device. For instance, the planar FET 102 demonstrates no co-vertical component between the source 106/drain 108 and a gate 110, such that capacitive-coupling between these shapes can be modeled with a simplified modeling methodology to obtain a reasonable capacitance accuracy, speeding up computation time for extraction. Next-generation devices such as the finFET 104 invalidate no co-vertical assumptions, while pure 3D extraction remains impractical for large designs (e.g., SRAM, PLL).

Accordingly, the present disclosure relates to a method and apparatus for accurate RC extraction. A pattern database is configured to store layout patterns and their associated 3D extraction parameters. A pattern-matching tool is configured to partition a design into a plurality of patterns, and to search the pattern database for a respective pattern and associated 3D extraction parameters. If the respective pattern is already stored in the pattern database, then the associated 3D extraction parameters stored in the database are assigned to the respective pattern without the need to extract the respective pattern. If the respective pattern is not stored in the pattern database, then the extraction tool extracts the pattern and stores its associated 3D extraction parameters in the pattern database for future use. In this manner a respective pattern is extracted only once for a given design or plurality of designs. Moreover, the extraction result may be applied multiple times for a given design simultaneously, speeding up computation time. The extraction result may also be applied to a plurality of designs simultaneously.

Figure 2:
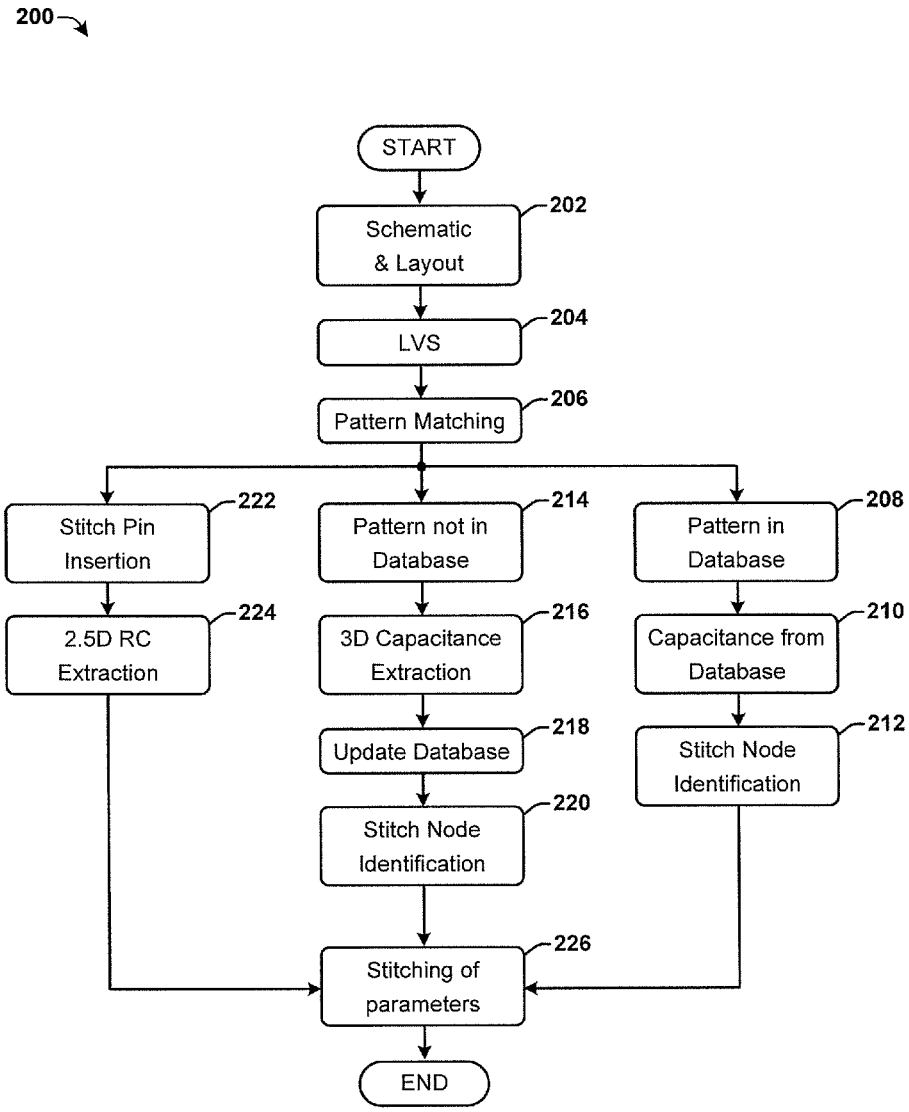
FIG. 2 illustrates a flow chart of some embodiments a method of RC extraction utilizing pattern-matching.

FIG. 2 illustrates a flow chart of some embodiments a method 200 of RC extraction utilizing pattern-matching. While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202 a schematic and associated layout of a design are produced.

At 204 a correspondence of the schematic and the layout is verified with a layout versus schematic (LVS) tool.

At 206 the layout is analyzed with a pattern-matching tool, which partitions the layout into a plurality of patterns, wherein a respective pattern comprises a one or more shapes comprising a partial device, a device, or multiple devices, as well as their surrounding environment. The partitioning of the layout results in three types of layout regions which together fully cover the layout: patterns that are stored in a pattern database, patterns that are not stored in a pattern database, a subset of the layout not comprising any patterns (e.g., the layout minus the recognized patterns). Subsequent to the layout partitioning each of the three types of layout regions are treated separately, which in some embodiments may comprises treating the three types of layout regions concurrently, successively, or a combination thereof.

At 208 the pattern-matching tool determines that a first respective pattern of the plurality of patterns does have a corresponding first reference pattern and associated first reference extraction parameters stored in a pattern database.

At 210 an extraction tool applies the first reference extraction parameters to the first respective pattern without performing extraction. In some embodiments the first reference extraction parameters comprise capacitance values for various shapes comprising the first respective pattern.

At 212 one or more first stitch-nodes of the first respective pattern are identified by the extraction tool, wherein a respective stitch-node comprises a location on a shape comprising the first respective pattern where one or more extraction parameters are assigned (e.g., a capacitance value).

At 214 the pattern-matching tool determines that a second respective pattern of the plurality of patterns does not have a corresponding second reference pattern stored in the pattern database.

At 216 the extraction tool performs extraction on the second respective pattern to obtain corresponding second extraction parameters. In some embodiments the extraction tool performs 3D extraction of the second respective pattern to obtain capacitance values for various shapes comprising the second respective pattern.

At 218 the second pattern and associated second extraction parameters are stored in the pattern database for reuse as a second reference pattern and second reference extraction parameters, respectively.

At 220 one or more second stitch-nodes of the second respective pattern are identified by the extraction tool.

At 222 a first stitch-pin is inserted to each respective first stitch-node, and a second stitch-pin is inserted to each respective second stitch-node, wherein a stitch-pin comprises a marker to inform the extraction tool to create a stitch-node to assign appropriate extraction parameters after the patterns are reassembled.

At 224 remaining extraction parameters within a subset of the layout not comprising the first respective pattern or second respective pattern are determined. In some embodiments determining the remaining extraction parameters comprises utilizing an extraction tool which performs 2.5D extraction to determine extraction parameters between a first bounding box of the first respective pattern and surrounding shapes comprising the subset of the layout, and 2.5D extraction to determine extraction parameters between a second bounding box of the second respective pattern and surrounding shapes comprising the subset of the layout. In some embodiments the extraction tool only determines a first subset of the overall extraction parameters needed to model the layout. For instance, 2.5D capacitance parameters may be determined between the aforementioned bounding boxes and surrounding shapes, and resistance parameters for the flat layout irrespective of the patterns.

At 224 stitching of parameters if performed to form a netlist of the layout. The first extraction parameters, second extraction parameters, and remaining extraction parameters comprise a first extracted netlist of the first respective pattern, a second extracted netlist of the second respective pattern, and a third extracted netlist of the subset of the layout, respectively. Stitching of parameters comprises combining the first extracted netlist, the second extracted netlist, and the third extracted netlist into a composite netlist of the layout and corresponding schematic by forming connections between all interacting combinations of first stitch-nodes, second stitch-nodes, and subset of the layout.

FIGS. 3A-3D illustrate some embodiments method of RC extraction utilizing pattern-matching in a layout. FIGS. 3A-3D are meant to illustrate some aspects of the method 200 described in FIG. 2 in an exemplary manner.

FIG. 3A illustrates a layout 300A comprising three devices 302A-306A disposed around a passive OD shape 308A. To determine extraction parameters for the three devices 302A-306A a pattern-matching method is employed. For the embodiments of FIGS. 3A-3D extraction parameters comprise capacitance values and resistance values. FIG. 3B illustrates creation of a bounding box 302B-306B around respective devices 302A-306A, wherein 3D capacitance values will be determined within a respective bounding box 302B-306B after layout partitioning. In FIG. 3C, the layout 300A is partitioned into two patterns 302C and 304C by a pattern-matching tool, wherein a respective pattern comprises one of the three devices 302A-306A and a portion of the OD shape 308A. Note that 302C is a redundant pattern corresponding to both device 304A and device 306A. For the embodiments of FIGS. 3A-3D, coupling capacitance between shapes or portions of shapes with no common run length (i.e., no parallel edges) is assumed to be negligible. Therefore, only the portion of the OD shape 308A with a common run length with a respective device 302A-306A is considered in patterns 302C and 304C.

An extraction tool determines that a pattern 302C does not have a corresponding first reference pattern stored in a pattern database which is referenced by the pattern-matching tool, and thus performs extraction on pattern 302C to obtain associated first 3D capacitance values for pattern 302C. The extraction tool further determines that a pattern 304C does have a corresponding reference pattern stored in a pattern database, as well as associated second 3D capacitance values, and applies the second 3D capacitance values to pattern 304C. For the embodiments of FIGS. 3A-3D no symmetry is employed in pattern-recognition. For instance pattern 304C is identical to pattern 302C flipped about a vertical axis (y-axis). Other embodiments comprise locating reference patterns in the pattern database by rotating and/or flipping of a pattern.

FIG. 3D illustrates application of the capacitance parameters obtained in FIG. 3C to the layout 300A. The first 3D capacitance values obtained for pattern 302C are applied to devices 304A and 306A within bounding boxes 304B and 306B, respectively. The second 3D capacitance values to pattern 304C are applied to device 302A within bounding box 302B. The extraction tool then determines 2.5D capacitance values for the rest of the layout 300A, and resistance values for layout 300A. The combination of calculating 3D capacitance values within the bounding boxes 302B-306B and 2.5D capacitance values for the rest of the layout 300A offers a tradeoff in terms of accuracy and performance. After calculation of all extraction parameters is complete, stitching of parameters is performed to form a composite netlist of the layout by forming connections 302D between all interacting combinations of stitch-nodes 304D.

Figure 4A:
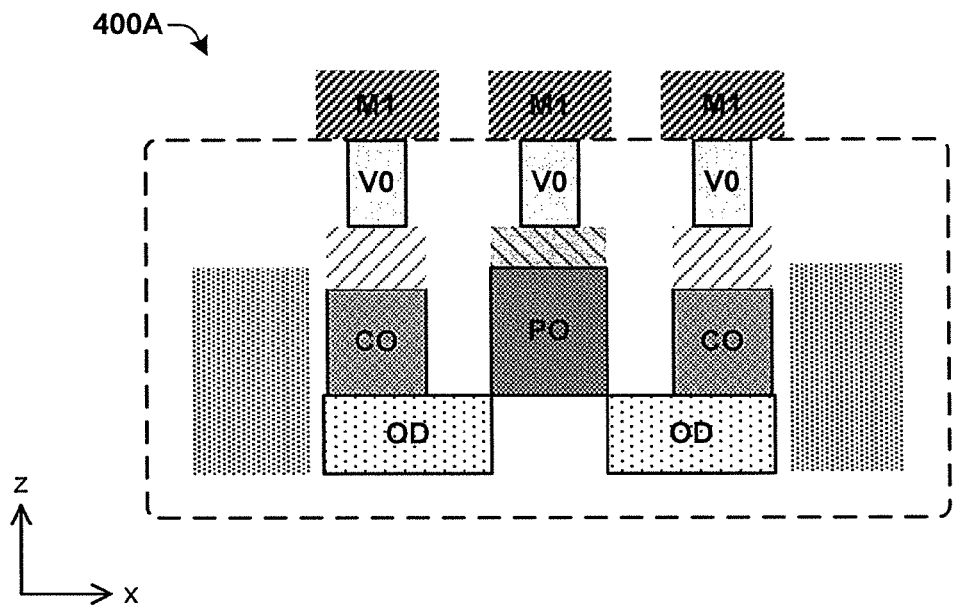
FIGS. 4A-4B illustrate some embodiments of pattern determination.

FIG. 4A illustrates some embodiments of pattern determination 400A, wherein a pattern comprises a set of one or more main shapes comprising a set of polygons comprising a devices, subsets of devices (e.g., a source and a gate, or a gate and a drain), and polygons such as PO and OD. In some embodiments the main shapes may further comprise middle-end of line (MEOL) levels that form connections between front-end of line (FEOL) devices and back-end of line (BEOL) metallization levels (M1) such as device contacts (CO) and via interconnects (V0). The main shapes are placed in a context comprising a subset of designed levels defining a layout with which the main shapes interact and further comprise combinations of FEOL, MEOL, and BEOL levels. A context may be empty, or a device from a first pattern may comprise a context of a second pattern, etc.

Figure 4B:
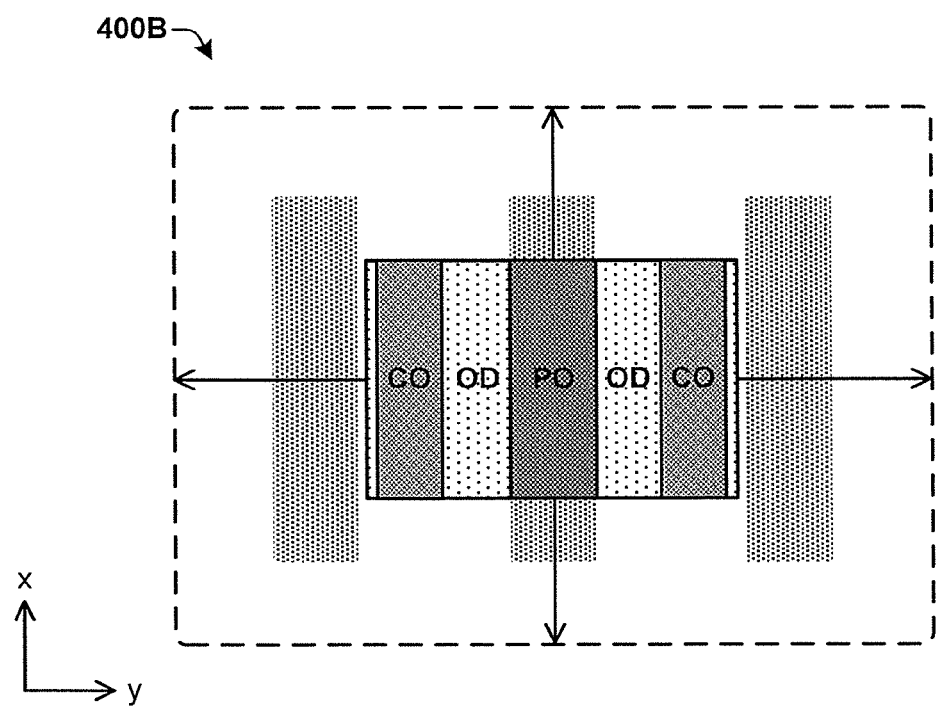

FIG. 4B illustrates some embodiments of a bounding box 400B for pattern determination. A size of the bounding box 400B may be determined by a combination of several factors including layout design rules, shape periodicity, etc. The size of the bounding box may also be determined by an interaction range with a pattern's environment. Within the bounding box shape symmetry to exploited to maximize pattern recognition. A pattern may be flipped or rotated about an x-axis, a y-axis, or a combination thereof to limit redundant patterns. The main shapes, context, and bounding box are not sufficient to accurately define a pattern, as determining extraction parameters requires knowledge of main shape thickness not contained in a layout. As such, a shape reference file comprising information about thickness of the one or more main shapes and context is included in the pattern definition, and may be stored within the extraction tool or pattern database.

Figure 5A:
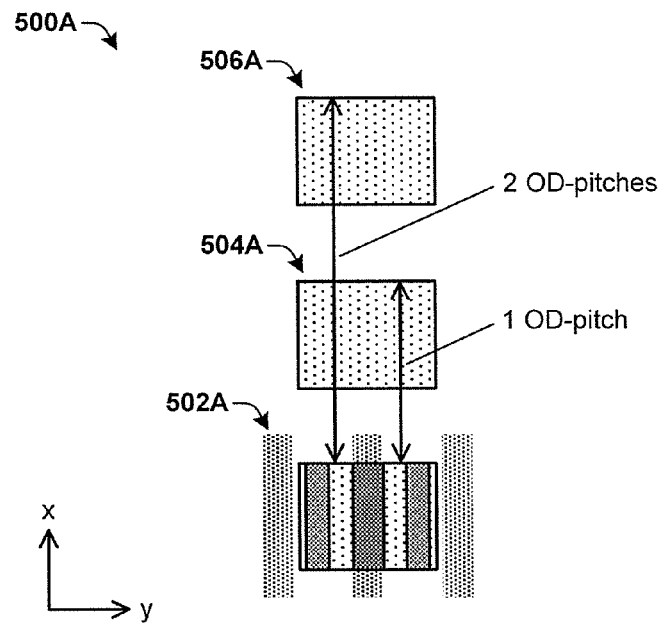
FIGS. 5A-5C illustrate some embodiments of context determination.
Figure 5B:
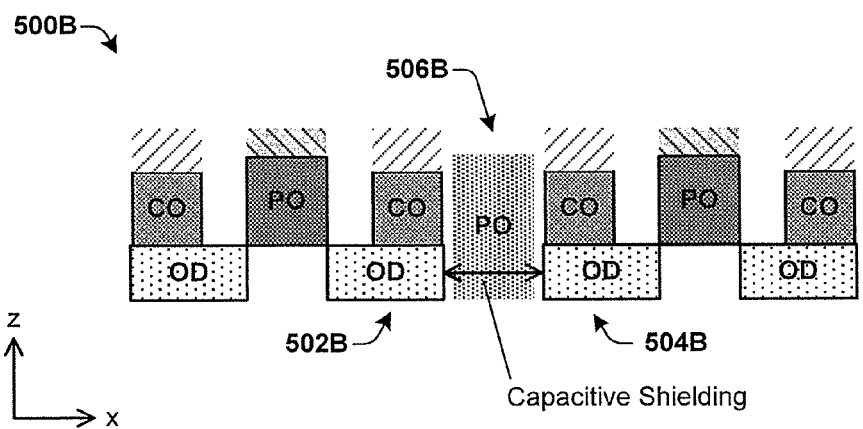
Figure 5C:
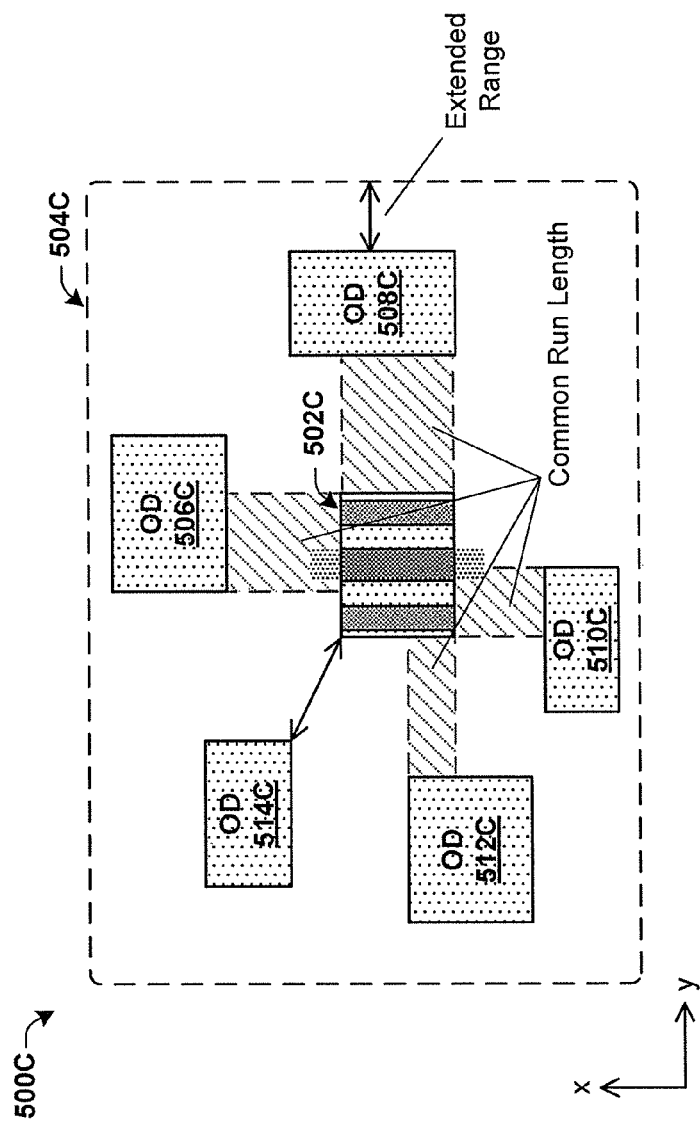

In some embodiments, context determination may further comprise certain assumptions and/or approximations to increase extraction efficiency without appreciable loss of accuracy. One example comprises, but is not limited to, coupling capacitance between polygons wherein the coupling is so weak that it can be ignored with minimal impact of modeling (i.e., ignoring the coupling capacitance degrades model accuracy within an acceptable range). FIGS. 5A-5C illustrate some additional embodiments of context determination comprising "rules of thumb" for extraction simplification, wherein knowledge of contextual layout features allow for simplification of extraction.

FIG. 5A illustrates an exemplary embodiment of capacitance measurement 500A within a fixed range based upon layout design rules. A device 502A is disposed adjacent a first passive OD shape 504A and a second passive OD shape 506A. The first passive OD shape 504A resides one OD-pitch away from the device 502A, wherein a "pitch" is a measure of periodicity for objects placed periodically in a layout. The second passive OD shape 506A resides 2 OD pitches away from the device 502A. Incorporation of course gridding in layout design rules allows coupling capacitance effects larger than an integer number of OD pitches to be ignored, resulting in a reduced number of shapes for extraction to consider. Other examples of fixed range simplifications may comprise, but are not limited to, PO pitch, metal pitch, or a combination thereof.

FIG. 5B illustrates an exemplary embodiment of capacitance measurement 500B with capacitive shielding effects included, wherein two objects capacitively coupled may see the coupling weaken of a third object is placed between them. For instance, a first OD shape 502B and second OD shape 504B experience coupling capacitance between them. However, insertion of an inactive PO shape 506B between the first OD shape 502B and the second OD shape 504B reduces their coupling capacitance. If the width of the PO shape 506B is increased beyond a pre-defined threshold, the coupling capacitance will be reduced to a value small enough that it can be ignored; that is OD shape 502B and OD shape 504B may not need to be in the same pattern for extraction.

FIG. 5C illustrates an exemplary embodiment of capacitance measurement 500C with a common run length approximation. A device 502C is surrounded by a bounding box 504C containing a plurality of OD shapes 506C-514C. The size of the bounding box 504C is adjusted to incorporate an extended range of interaction around the plurality of OD shapes 506C-514C comprising a context of a pattern formed by the device 502C and plurality of OD shapes 506C-514C. The extended range is defined to more accurately capture the overall capacitive coupling between all shapes within the bounding box 504C. In some embodiments, capacitive coupling between two shapes is only assumed for common run lengths (i.e., no parallel edges) using a "parallel plate" model. Shapes with no common run length are assumed to have zero capacitive coupling, or more generically capacitive coupling may be assumed run lengths greater than a pre-defined threshold (e.g., some fraction of a shape or device size).

Figure 6:
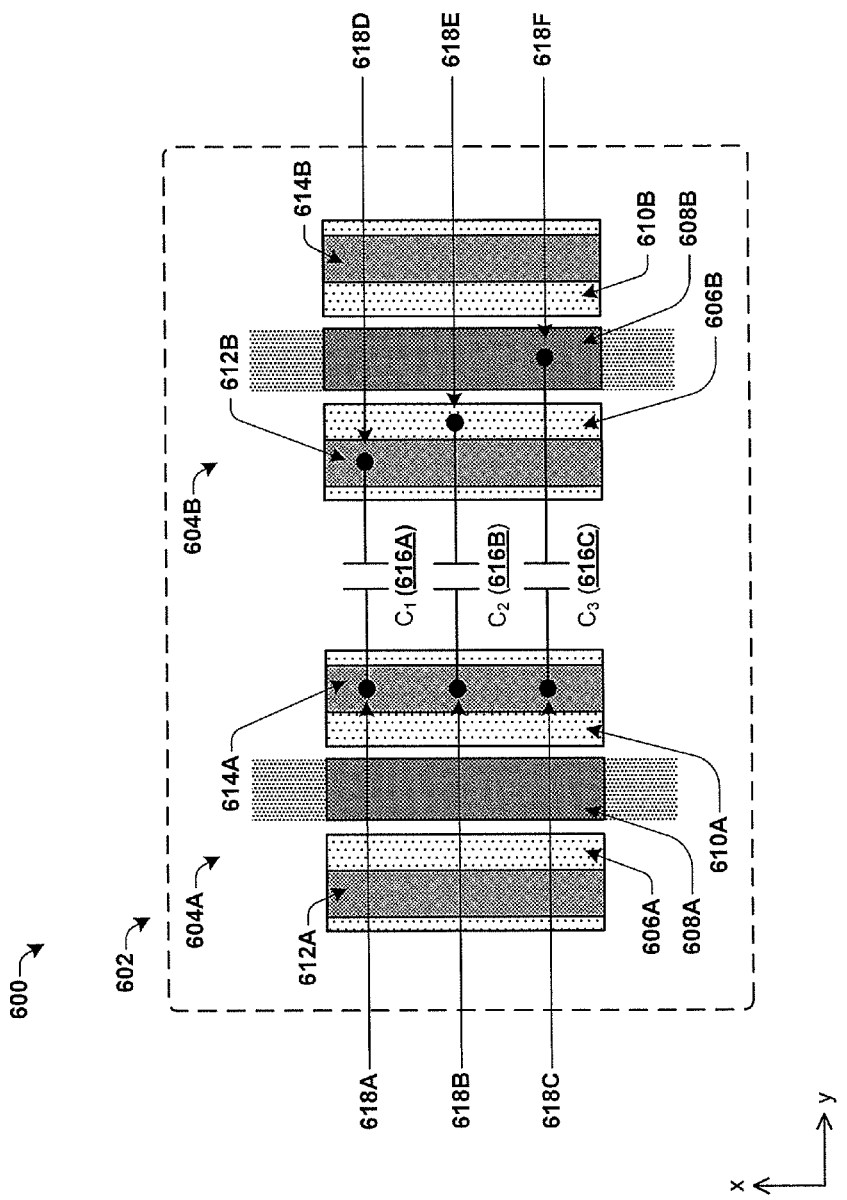
FIG. 6 illustrates some embodiments of stitch-node identification.

FIG. 6 illustrates some embodiments of stitch-node identification within a pattern 600 for capacitive coupling between field-effect transistors (FETs). The pattern 600 comprises a bounding box 602 which surrounds a first FET 604A and a second FET 604B. The first FET 604A and the second FET 604B further comprise a first source 606A and second source 606B respectively, a first gate 608A and a second gate 608B respectively, a first drain 610A and a second drain 610B respectively, a first source CO 612A and a second source CO 612B respectively, and a first drain CO 614A and a second drain CO 614B respectively. The exemplary embodiment of pattern 600 comprises capacitive coupling between the first FET 604A and a second FET 604B. In this non-limiting example, pairwise capacitive coupling between shapes is represented for a subset of possible interactions to promote understanding. This example is by no means exhaustive, and should not be seen as a limitation of the scope of this embodiment.

The first drain CO 614A is subject to capacitive coupling to other shapes within the pattern 600. Among these are a first coupling capacitance $C_1$ 616A between the first drain CO 614A and the second source CO 612B, a second coupling capacitance $C_2$ 616B between the first drain CO 614A and the second source 606B, and are a third coupling capacitance $C_3$ 616C between the first drain CO 614A and the second gate 608B. As is known to one of ordinary skill in the art, these coupling capacitances 616A-616C are incorporated into a netlist of the pattern through stitch-node identification, and stitch-pin insertion.

Each coupling capacitance 616A-616C is modeled in the netlist of pattern 600 by incorporating a stitch-pin on each shape that experiences a respective coupling capacitance. The first coupling capacitance $C_1$ 616A therefore results in identification of a first stitch-node 618A on the first drain CO 614A, and a second stitch-node 618B on the second source CO 612B. Likewise, the second coupling capacitance $C_2$ 616B results in identification of a third stitch-node 618C on the first drain CO 614A, and a forth stitch-node 616D on the second source 606B. And, the third coupling capacitance $C_3$ 616C results in identification of a fifth stitch-node 616E on the first drain CO 614A, and a sixth stitch-node 616F on the second gate 608B. Each stitch-node 618A-618F has a unique name (e.g., the third stitch-node 618C may be called FET1_drain_PO, etc) such that an extraction tool may define a respective stitch-pin for each respective stitch-node, wherein a stitch-pin comprises a marker added to the layout to inform the extraction tool to create a stitch-node to assign appropriate extraction parameters to the pattern.

Figure 7:
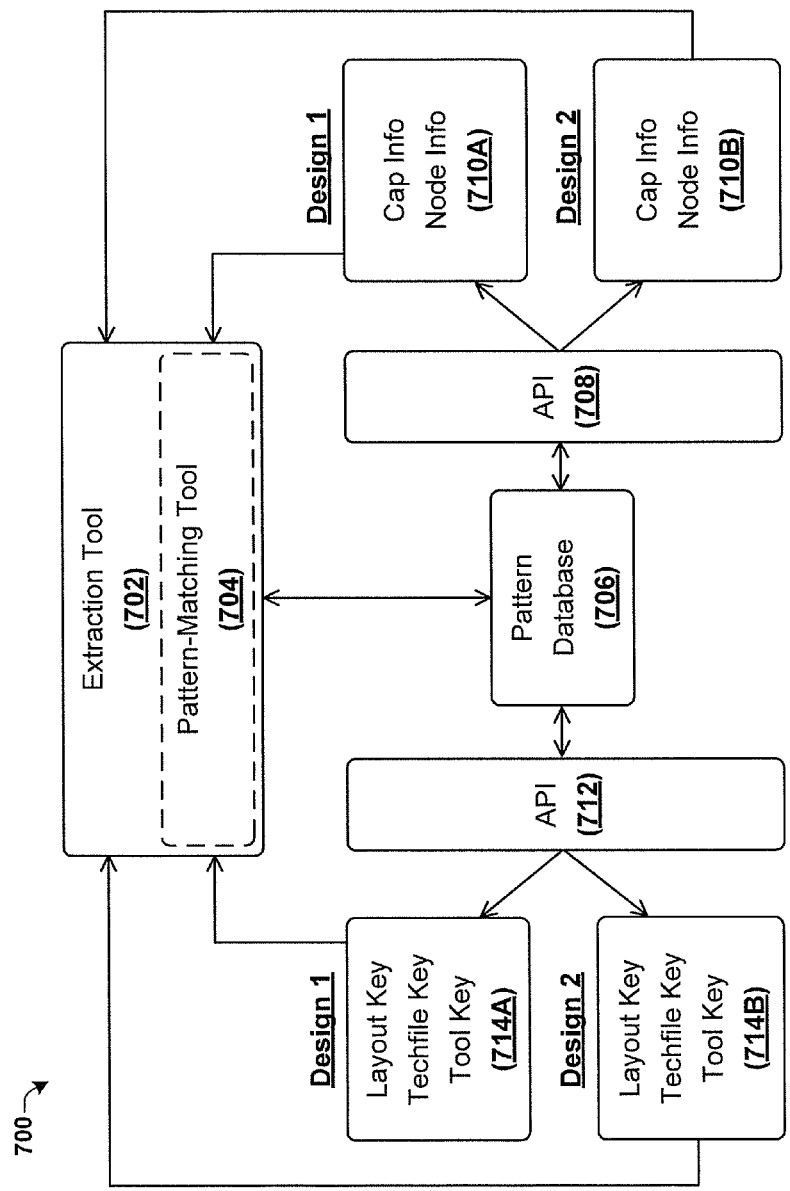
FIG. 7 illustrates some embodiments of a pattern and extraction storage system.

FIG. 7 illustrates some embodiments of a pattern and extraction storage system 700. A parasitic extraction tool 702 comprising a pattern-matching tool 704 is configured to partition a design (e.g., a layout) into a plurality of patterns, wherein a respective pattern comprises a one or more shapes comprising a partial device, a device, or multiple devices, as well as their surrounding environment. A pattern database 706 is referenced by the pattern-matching tool 704 and configured to store a respective pattern as a reference pattern and associated extraction parameters. The pattern database 706 is further configured to retrieve the reference pattern if an identical pattern is observed in a second design and apply extraction parameters of the identical pattern without re-running parasitic extraction on the identical pattern.

The pattern and extraction storage system 700 further comprises a first application programming interface (API) 708 coupled to the pattern database 706, wherein the first API 708 retrieves node and capacitance parameters for a plurality of designs 710A and 710B with a given query. A second API 712 is also coupled to the pattern database 706, wherein the extraction tool 702 utilizes the second API 712 to query an extraction result comprising layout information, shape reference data, and tool type queries concurrently from a plurality of designs comprising a first design 714A and a second design 714B.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a method and apparatus for accurate RC extraction. A pattern database is configured to store layout patterns and their associated 3D extraction parameters. A pattern-matching tool is configured to partition a design into a plurality of patterns, and to search the pattern database for a respective pattern and associated 3D extraction parameters. If the respective pattern is already stored in the pattern database, then the associated 3D extraction parameters stored in the database are assigned to the respective pattern without the need to extract the respective pattern. If the respective pattern is not stored in the pattern database, then the extraction tool extracts the pattern and stores its associated 3D extraction parameters in the pattern database for future use. In this manner a respective pattern is extracted only once for a given design or plurality of designs. Moreover, the extraction result may be applied multiple times for a given design simultaneously, speeding up computation time. The extraction result may also be applied to a plurality of designs simultaneously.

In some embodiments the present disclosure relates to a method of RC extraction utilizing pattern-matching, comprising analyzing a layout with a pattern-matching tool to partition the layout into a plurality of patterns, determining that a first respective pattern does not have a corresponding first reference pattern stored in a pattern database, and therefore performing extraction on the first respective pattern to obtain associated first extraction parameters. The first respective pattern and associated first extraction parameters are then stored as the first reference pattern and first reference extraction parameters respectively in the pattern database for reuse.

Subsequently, a second respective pattern of the plurality of patterns is found to have a corresponding second reference pattern and associated second reference extraction parameters that are stored the pattern database. Therefore, the second reference extraction parameters may be applied to the second respective pattern without the need to run extraction on the second respective pattern.

In some embodiments the present disclosure relates to a method of defining a pattern of a layout, comprising defining set of one or more main shapes in a layout, and defining a context for the set of one or more main shapes comprising a subset of designed levels defining a layout with which the main shapes interact. The main shapes and context only comprise 2D information about the layout. Therefore, a shape reference file comprising information about thickness of the main shapes is defined. The pattern is then placed in a locality about the main shapes within the context which defines a boundary of the pattern.

In some embodiments the present disclosure relates to a pattern and extraction storage system, comprising a parasitic extraction tool comprising a pattern-matching tool configured to partition the design into a plurality of patterns, and a pattern database which is referenced by the pattern-matching tool and configured to store a respective pattern as a reference pattern and associated extraction parameters.

What is claimed is:

1. A method of RC extraction utilizing pattern-matching, comprising:
   analyzing a layout with a pattern-matching tool configured to partition the layout into a plurality of patterns
   determining that a first respective pattern of the plurality of patterns does not have a corresponding first reference pattern stored in a pattern database with the pattern-matching tool
   determining that a second respective pattern of the plurality of patterns does have a corresponding second reference pattern and associated second extraction parameters stored in the pattern database with the pattern-matching tool;
   performing extraction on the first respective pattern to obtain associated first extraction parameters with an extraction tool;
   applying second extraction parameters to the second respective pattern from the pattern database;
   identifying one or more first stitch-nodes of the first respective pattern, wherein a first stitch-node comprises a location on a first shape of the first respective pattern where one or more first extraction parameters are assigned; and
   identifying one or more second stitch-nodes of the second respective pattern, wherein a second stitch-node comprises a location on a second shape of the second respective pattern where one or more second extraction parameters are assigned.

2. The method of claim 1, further comprising storing a first respective pattern and associated first extraction parameters as the first reference pattern and first extraction parameters respectively in the pattern database for reuse.

3. The method of claim 2, wherein no pattern in the plurality of patterns is pre-characterized such that all respective patterns are assigned extraction parameters.

4. The method of claim 1, wherein determining whether a respective pattern of the plurality of patterns has a corresponding reference pattern stored in a pattern database further comprises rotating and flipping the respective pattern.

5. The method of claim 4, wherein the first extraction parameters and second extraction parameters comprise a 3-dimensional capacitance within a bounding box of a respective pattern.

6. The method of claim 1, further comprising determining remaining extraction parameters within a subset of the layout not comprising the first respective pattern or second respective pattern, after stitch-pin insertion with the extraction tool.

7. The method of claim 6, wherein the remaining extraction parameters comprise:
- 2.5-dimensional capacitance parameters between a first bounding box of the first respective pattern and surrounding shapes comprising the subset of the layout;
- 2.5-dimensional capacitance parameters between a second bounding box of the second respective pattern and surrounding shapes comprising the subset of the layout; and
- resistance parameters for the layout.

8. The method of claim 6, further comprising defining a respective stitch-pin for each respective stitch-node from a set of stitch-nodes comprising the first stitch-nodes and second stitch-nodes.

9. The method of claim 6, wherein the first extraction parameters, second extraction parameters, and remaining extraction parameters further comprise a first extracted netlist of the first respective pattern, a second extracted netlist of the second respective pattern, and a third extracted netlist of the subset of the layout, respectively.

10. The method of claim 9, further comprising combining the first extracted netlist, the second extracted netlist, and the third extracted netlist into a composite netlist of the layout and an associated schematic by forming connections between all interacting combinations of first stitch-nodes, second stitch-nodes, and subset of the layout.

11. The method of claim 1, further comprising:
- inserting a first stitch-pin to each of the one or more first stitch-nodes;
- inserting a second stitch-pin to each of the one or more second stitch-nodes; and
- forming a netlist of the layout by forming connections between interacting combinations of first stitch-pins and second stitch-pins.

12. A pattern and extraction storage system, comprising:
- a parasitic extraction tool comprising a pattern-matching tool configured to partition a design into a plurality of patterns, determine that a first respective pattern of the plurality of patterns does not have a corresponding first reference pattern stored in the pattern database, and determine that a second respective pattern of the plurality of patterns does have a corresponding second reference pattern and associated second extraction parameters stored in the pattern database;
- wherein the pattern database is configured to apply the second extraction parameters to the second respective pattern; and
- wherein the parasitic extraction tool is configured to perform extraction on the first respective pattern to obtain associated first extraction parameters, identify one or more first stitch-nodes of the first respective pattern as a location where the one or more first extraction parameters are assigned, and identify one or more second stitch-nodes of the second respective pattern as a location where the one or more second extraction parameters are assigned.

13. The pattern and extraction storage system of claim 12, wherein the pattern database is configured to retrieve the reference pattern if an identical pattern is observed in a second design and apply the extraction parameters of the identical pattern without running any parasitic extraction on the identical pattern.

14. The pattern and extraction storage system of claim 13, further comprising a first application programming interface (API) coupled to the pattern database, wherein the first API retrieves node and capacitance parameters for a plurality of designs with a given query from the parasitic extraction tool.

15. The pattern and extraction storage system of claim 13, further comprising a second API coupled to the pattern database, wherein the extraction tool utilizes the second API to query an extraction result comprising layout information, shape reference data, or tool type queries concurrently from a plurality of designs.

16. The pattern and extraction storage system of claim 12, wherein the parasitic extraction tool is further configured to insert a first stitch-pin to the one or more first stitch-nodes, and insert a second stitch-pin to the one or more second stitch-nodes.

17. The pattern and extraction storage system of claim 16, wherein the parasitic extraction tool is further configured to form a netlist of the design by forming connections between interacting combinations of first stitch-pins and second stitch-pins.

* * * * *